United States Patent [19]

Akutsu

[11] Patent Number: 5,382,095
[45] Date of Patent: Jan. 17, 1995

[54] STATIC PRESSURE BEARING DEVICE
[75] Inventor: Kotaro Akutsu, Machida, Japan
[73] Assignee: Canon Kabushiki Kaisha, Tokyo, Japan
[21] Appl. No.: 195,199
[22] Filed: Feb. 14, 1994
[30] Foreign Application Priority Data
Feb. 22, 1993 [JP] Japan .................. 5-056448
[51] Int. Cl.⁶ .............................. F16C 32/06
[52] U.S. Cl. ............................ 384/100; 384/1; 384/12; 384/902
[58] Field of Search ............ 384/1, 12, 100, 107, 384/279, 902

[56] References Cited
U.S. PATENT DOCUMENTS

| | | | |
|---|---|---|---|
| 4,569,562 | 2/1986 | Sato et al. | 384/100 X |
| 4,744,675 | 5/1988 | Sakino et al. | 384/12 |
| 4,838,710 | 6/1989 | Ohta et al. | 384/902 X |
| 5,064,297 | 11/1991 | Tanaka et al. | 384/100 |
| 5,184,055 | 2/1993 | Ohishi et al. | 318/615 |

Primary Examiner—Thomas R. Hannon
Attorney, Agent, or Firm—Fitzpatrick, Cella, Harper & Scinto

[57] ABSTRACT

An apparatus for preventing the self-excited vibration of a static pressure bearing device includes a movable bed and a porous pad. The movable bed is noncontactly supported by the static pressure of pressurized fluid spouted from the porous pad toward the surface of a fixed bed. The porous pad is designed such that the natural frequency of a vibration system including the movable bed is regulated so that among the fluctuation components of the static pressure when the dimension of a bearing gap varies periodically, a periodic fluctuation component having a phase delay of 90° relative to a decrease in the dimension of the bearing gap may be positive and of a frequency equal to the aforementioned natural frequency.

5 Claims, 5 Drawing Sheets

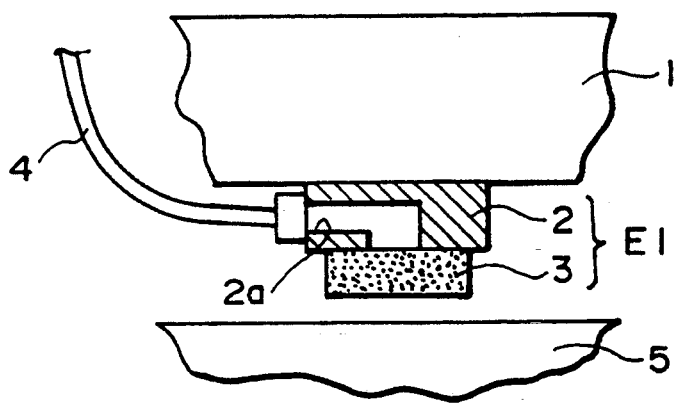
F I G. 1
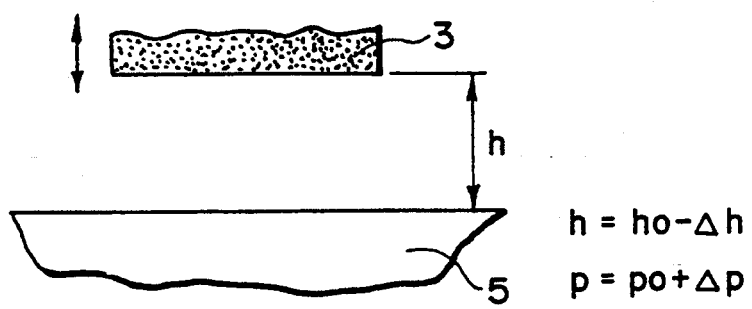
$h = h_0 - \Delta h$
$p = p_0 + \Delta p$
F I G. 2A
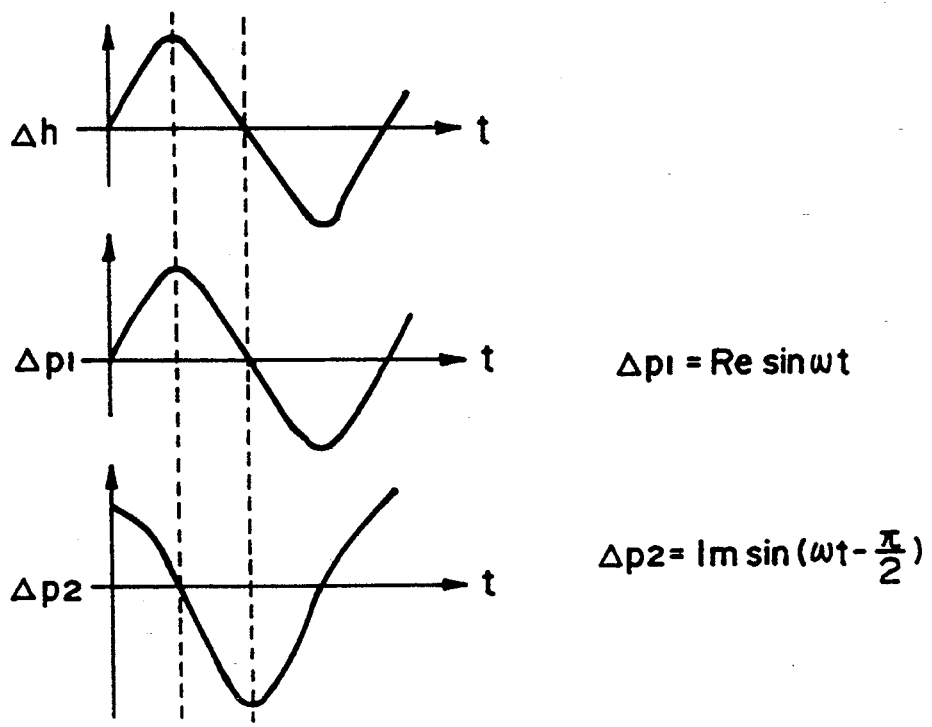
$\Delta p_1 = Re \sin \omega t$
$\Delta p_2 = Im \sin(\omega t - \frac{\pi}{2})$
F I G. 2B

STATIC PRESSURE BEARING DEVICE

BACKGROUND OF THE INVENTION

1. Field of the Invention

This invention relates to a static pressure bearing device for use in an XY stage of a semiconductor exposing apparatus, or the positioning stages of a precision machine tool and a precision measuring machine or the like.

2. Related Background Art

The XY stage of a semiconductor exposing apparatus and the positioning stages of a precision machine tool and a precision measuring machine or the like require highly accurate positioning and for this purpose, use is made of a static pressure bearing device for noncontactly supporting or guiding the XY stage or the positioning stage relative to a bed plate or the like.

The bearing characteristic of static pressure bearing devices greatly differ depending on the type of restrictor spouting pressurized gas used, and particularly, the frequency characteristic of the pressure fluctuation of a bearing gap when vibration in the XY stage or the positioning stage is generated is substantially constant in a static pressure bearing device of the conventional surface restrictor type or the orifice restrictor type, and the rigidity or the like thereof is not greatly varied by the vibration of the XY stage or the positioning stage. However, a static pressure bearing device of the porous restrictor type, as compared with the surface restrictor type or the orifice restrictor type, has the advantage that high bearing rigidity is obtained even if the amount of supply of pressurized fluid is small, while bearing rigidity may be remarkably reduced or the static pressure bearing device may cause self-excited vibration when vibration is generated in the positioning stage or the XY stage.

FIGS. 10 and 11 of the accompanying drawings are graphs obtained by measuring the pressure fluctuation of gas in the bearing gap of a static pressure bearing device of the porous restrictor type when the dimension of the bearing gap varies periodically, detecting a pressure fluctuation component (hereinafter referred to as the "Re component") of the same phase as the periodical reduction in the dimension of the bearing gap and a pressure fluctuation component (hereinafter referred to as the "Im component") having a phase delay of 90° relative thereto, and obtaining the frequency characteristics of these components. As can be seen from these figures, when for example, the natural frequency of the XY stage or the positioning stage is 150–160 Hz, the Im component is of a negative value and therefore, self-excited vibration as shown in FIG. 12 of the accompanying drawings is generated and as a result, the positioning accuracy of the XY stage or the positioning stage may be remarkably reduced, and the apparatus may be damaged by increasing vibration.

Accordingly, by using a static pressure bearing device of the porous restrictor type in which a predetermined amount of clogging is generated in advance to thereby vary the bearing characteristic or severely restrict permeability or transmittance of porous material, it is contrived to prevent the self-excited vibration of the static pressure bearing device of the porous restrictor type.

SUMMARY OF THE INVENTION

According to the above-mentioned conventional art, however, a method of clogging the static pressure bearing device of the porous restrictor type to thereby improve the bearing characteristic thereof requires considerable labor and time and reduces the productivity of the static pressure bearing device. Also, even if the permeability or transmittance of the porous material is severely restricted, the frequency characteristic of the bearing could not be greatly changed and it is difficult to prevent self-excited vibration.

The present invention has been made in view of the unsolved problem of the conventional art and has as its object the provision of a static pressure bearing device of the porous restrictor type which is free of the possibility of causing self-excited vibration.

To achieve the above object, the static pressure bearing device of the present invention has spouting means of the porous restrictor type for spouting pressurized fluid into the gap between a pair of objects and noncontactly supporting the two objects by the static pressure of the pressurized fluid. The spouting means is characterized in that when periodic variations in the dimension of the gap take place, the static pressure of the pressurized fluid lying in the gap has a periodic fluctuation component having a phase delay of 90° relative to a periodic decrease in the dimension of the gap, and the natural frequency of the vibration system of each of the objects is regulated so that the periodic fluctuation component may be of a positive value and of a frequency equal to the natural frequency.

Preferably, a porous material spouting the pressurized fluid may have permeability or transmittance of $5 \times 10^{-16} m^2$ or less and may have a porosity or porosity rate of 20% or less.

According to the above-mentioned device, when vibration occurs in each vibration system, pressure for attenuating it is included in the static pressure of the pressurized fluid and therefore, there is no possibility of self-excited vibration being caused in the static pressure bearing device. In a case that in the aforementioned frequency, the aforementioned periodic fluctuation component is zero or a negative value, the mass or the like of the vibration system of each object is increased or decreased to thereby vary the natural frequency, or predetermined clogging is generated in the spouting means to thereby make the frequency characteristic thereof vary.

Also, if porous material spouting the pressurized fluid has permeability or transmittance of $5 \times 10^{-16} m^2$ or less and has a porosity or porosity rate of 20% or less, the frequency area in which the periodic fluctuation component of the static pressure having a phase delay of 90° relative to the periodic decrease in the dimension of the gap is positive exists on the low frequency side and therefore, even if the natural frequency of the vibration system of each object is low, there is no possibility of self-excited vibration being caused.

BRIEF DESCRIPTION OF THE DRAWINGS

FIG. 1 is a schematic side view for illustrating an embodiment of the present invention.

FIGS. 2A and 2B illustrate pressure fluctuation when the dimension of a bearing gap in the static pressure bearing device of FIG. 1 is made to vary, FIG. 2A being a schematic view showing the bearing gap on an enlarged scale, and FIG. 2B showing a graph illustrating the relationship between each pressure fluctuation component and variations in the dimension of the bearing gap.

DETAILED DESCRIPTION OF THE PREFERRED EMBODIMENTS

Figure 3:
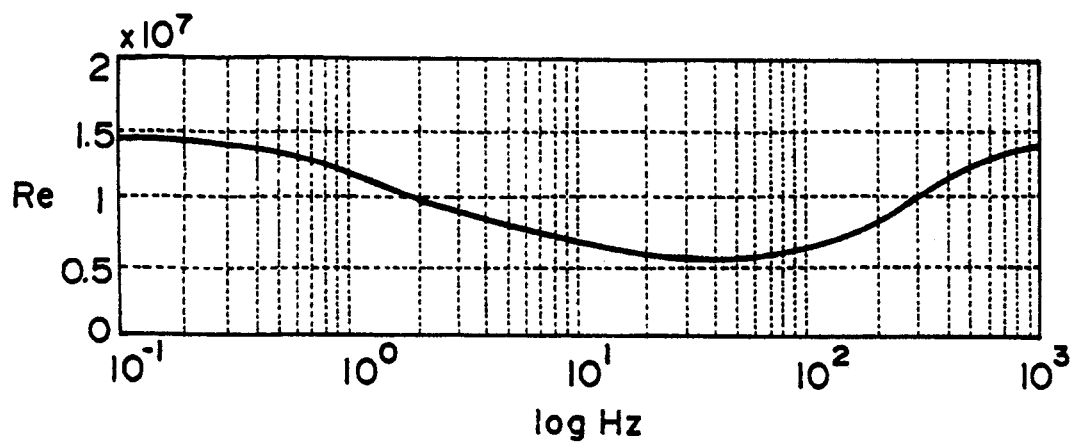
FIG. 3 is a graph showing frequency characteristic of the Re component in the static pressure bearing device of FIG. 1.

Referring to FIG. 1 which is an illustration for illustrating a direct acting type positioning stage using a static pressure bearing device according to an embodiment of the present invention, the positioning stage has a movable bed 1 which is one object holding a workpiece such as a substrate on the upper surface thereof as viewed in FIG. 1, a bearing housing 2 integrally provided on the lower surface of the movable bed 1 as viewed in FIG. 1, and a porous pad 3 formed of a porous material which is spouting means held by the bearing housing 2, and the bearing housing 2 and the porous pad 3 together constitute a static pressure bearing device $E_1$ for spouting pressurized fluid or pressurized gas supplied from a pressurized gas supply line 4 via an internal flow path 2a in the bearing housing 2 toward the surface of a fixed bed 5 which is the other object, and keeping the movable bed 1 in noncontact with the surface, and the movable bed 1 is moved along the surface of the fixed bed 5 by a driving apparatus, not shown. The natural frequency of the positioning stage which is a vibration system including the movable bed 1, the bearing housing 2, the porous pad 3 and other members integrally coupled to these is calculated as 200 Hz, and the positioning stage resonates at this frequency.

The porous pad 3 is formed of a porous material having a thickness of 5-6 mm, a permeability or transmittance of $5 \times 10^{-16} m^2$ or less and a porosity or porosity rate of 20% or less, and dimension $h_0$ of the bearing gap when in its balanced state is 4-6 μm, and the pressure of the pressurized gas supplied thereto is 4 kg/cm²g.

The frequency characteristics of the Re component and Im component of the porous pad 3 are found by vibrating the movable bed 1 at a predetermined frequency and measuring the amount of variation Δp in the static pressure of the gas existing in the bearing gap caused by the dimension h of the bearing gap decreasing by Δh from the value $h_0$ in the balanced state, as shown in FIG. 2A, and detecting, among the vibration components of the amount of variation Δp, a vibration component $Δp_1$, of the same phase as the amount of periodical decrease Δh in the dimension of the bearing gap and a vibration component $Δp_2$ which is a periodical fluctuation component having phase delay of 90° relative thereto, as shown in FIG. 2B.

Figure 4:
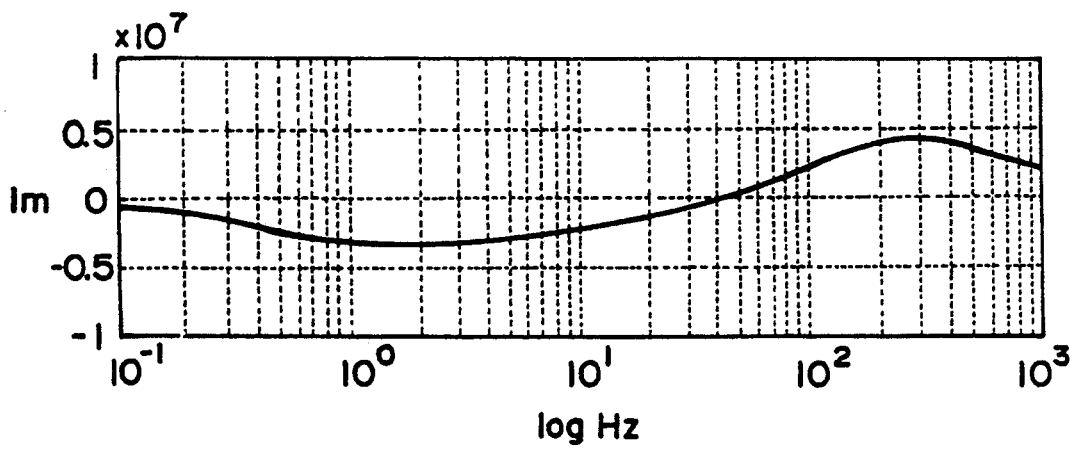
FIG. 4 is a graph showing frequency characteristic of the Im component in the static pressure bearing device of FIG. 1.

The thus found frequency characteristic of the Re component, as shown in FIG. 3, exhibits a value recovered from the minimum value in the vicinity of the frequency 200 Hz to some extent, and the Im component as shown in FIG. 4, is positive in the vicinity of the frequency 200 Hz and exhibits the maximum value thereof. Accordingly, if as previously described, the natural frequency of the positioning stage is 200 Hz, even if vibration occurs in the positioning stage, the vibration will calm down in a short time and there is no possibility of the Re component being remarkably reduced by the vibration, because the Im component is positive and great.

Figure 5:
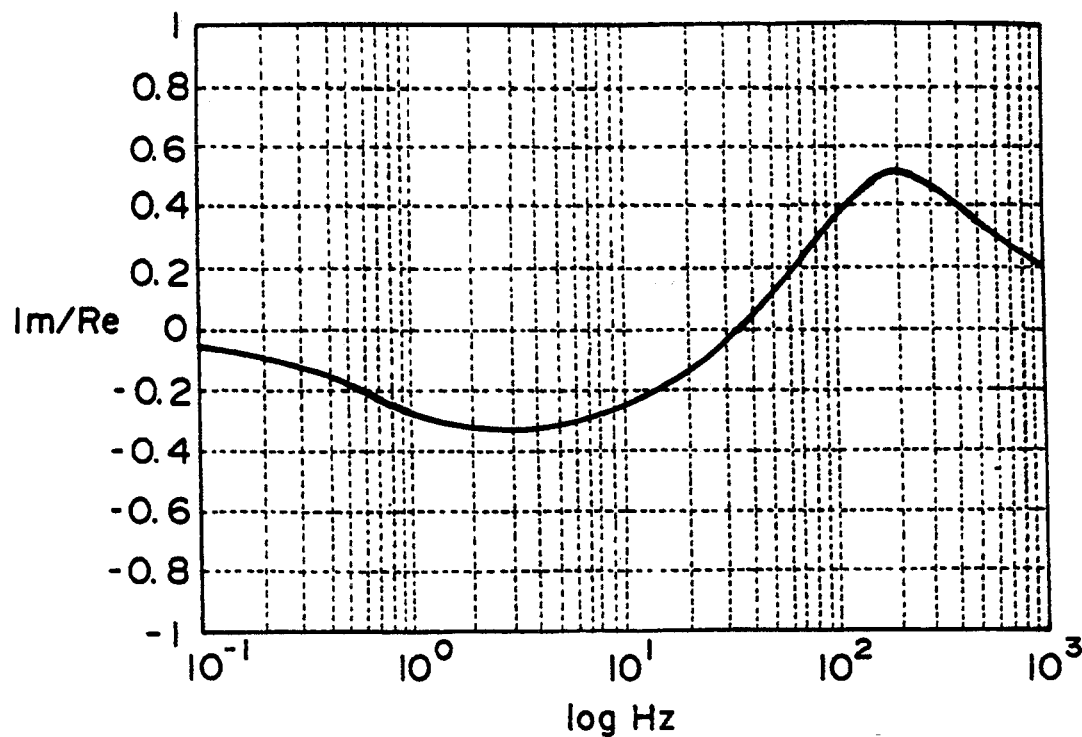
FIG. 5 is a graph in which the ratio between the Re component and the Im component obtained from FIGS. 3 and 4 is plotted.

FIG. 5 is a graph in which from FIGS. 3 and 4, a value of Im/Re has been calculated and plotted for each frequency, and it will be seen that the value of Im/Re has a maximum value in the vicinity of the frequency 200 Hz. The motion equation when the positioning stage of FIG. 1 vibrates in the vertical direction as viewed in FIG. 1 is expressed as follows:

$$\{(-M \times \omega^2)+(K \times Re)+(j \times K \times Im)\} \times Z = F \quad (1)$$

where
  K: a transformation coefficient for rendering the dimensions of the pressure fluctuation components Re and Im into a common dimension within the motion equation;
  M: inertia of the positioning stage;
  F: force applied to the positioning stage;
  ω: angular frequency
  j: complex number
  Z: displacement in positioning direction and gap direction.

Also, the natural frequency fn and attenuation ratio ξ of the positioning stage are expressed as follows:

$$fn = \frac{1}{2\pi} \sqrt{\frac{K \times (Re)}{M}} \text{ (Hz)} \quad (2)$$

$$\xi = \frac{(Im)}{2 \times (Re)} \text{ (\%)} \quad (3)$$

If the natural frequency fm is 200 Hz, the attenuation ratio ξ is calculated as 25% from FIG. 5 and equation (3).

Figure 6:
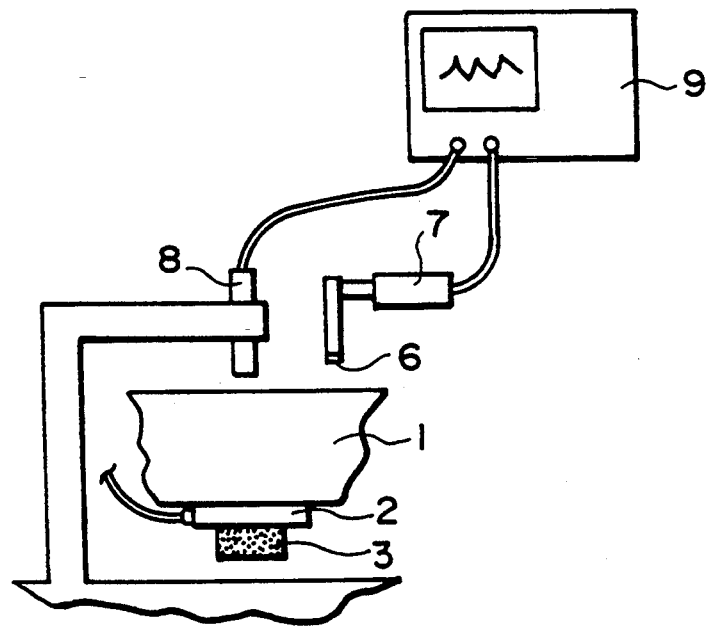
FIG. 6 is a schematic view illustrating an exciter used in an excitation experiment.
Figure 7:
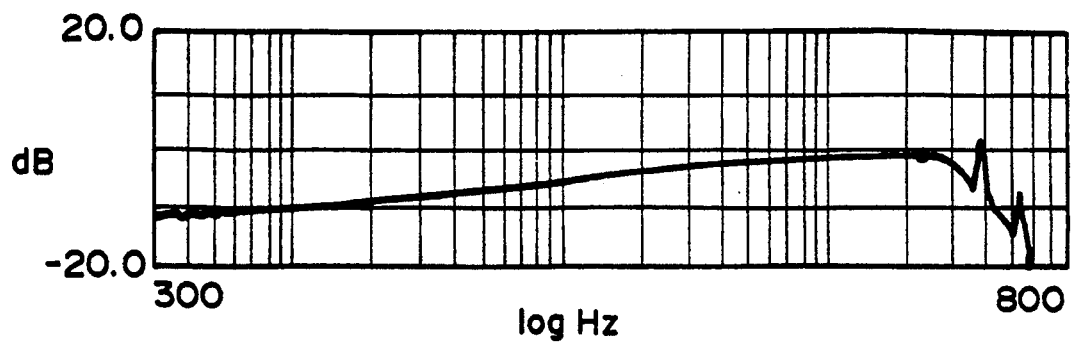
FIG. 7 is a graph showing the transmission characteristics of the load cell and displacement sensor of the exciter.

Next, the vibration characteristic of the positioning stage was measured by the use of a shaker as shown in FIG. 6. The shaker comprises an impact hammer 7 having a load cell 6 for measuring exciting force at the tip end thereof, a noncontact type displacement sensor 8 for measuring displacement of the movable bed 1, and an FFT (fast Fourier transform) device 9 for calculating the attenuation ratio ξ from output of the displacement sensor 8, where the transmission characteristic from the load cell 6 to the displacement sensor 8 is as shown in FIG. 7. When the attenuation ratio $\xi$ was measured with vibration forcibly caused in the movable bed 1 of the positioning stage by the impact hammer 7, it is found that a value exceeding 30% is obtained.

When the natural frequency of the positioning stage is the other value which is not in the vicinity of 200 Hz, the number of the porous pads can be increased or dimension or the like of the porous part can be adjusted.

Figure 10:
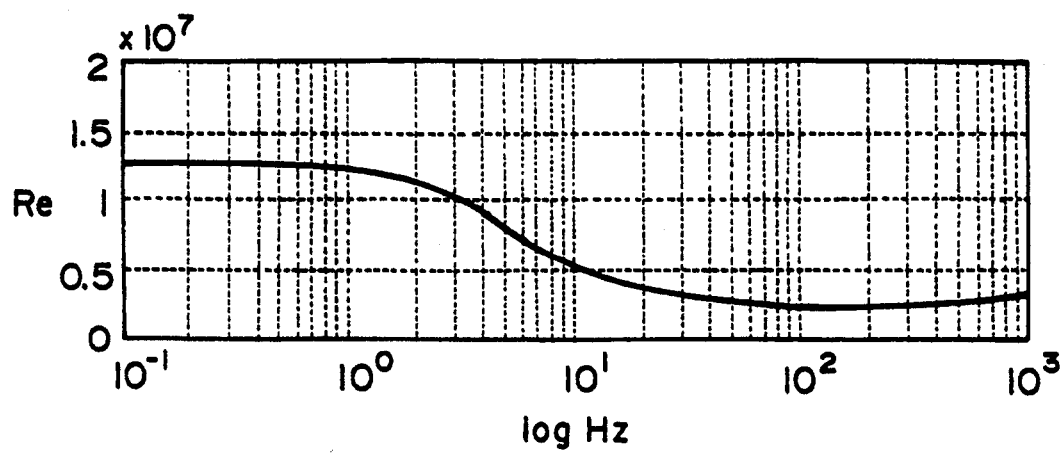
FIG. 10 is a graph showing the frequency characteristic of the Re component in a general static pressure bearing device.
Figure 11:
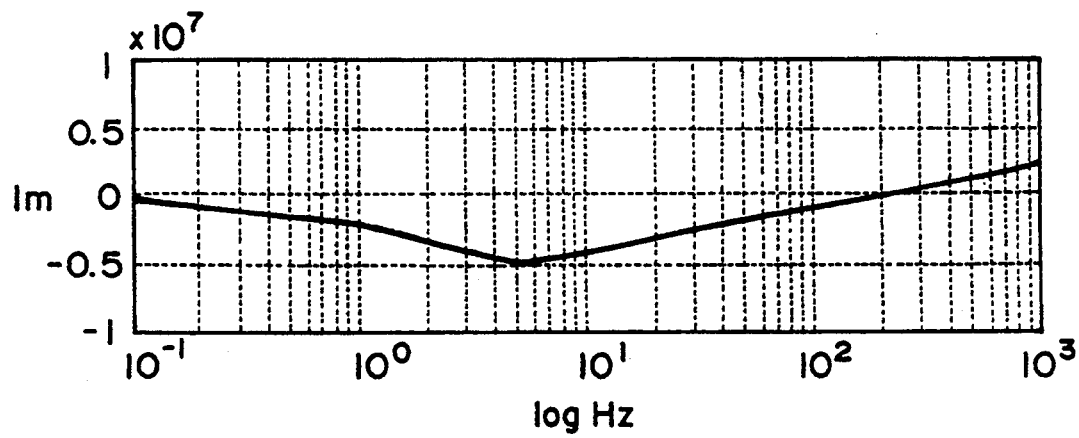
FIG. 11 is a graph showing the frequency characteristic of the Im component in the static pressure bearing device of FIG. 10.
Figure 12:
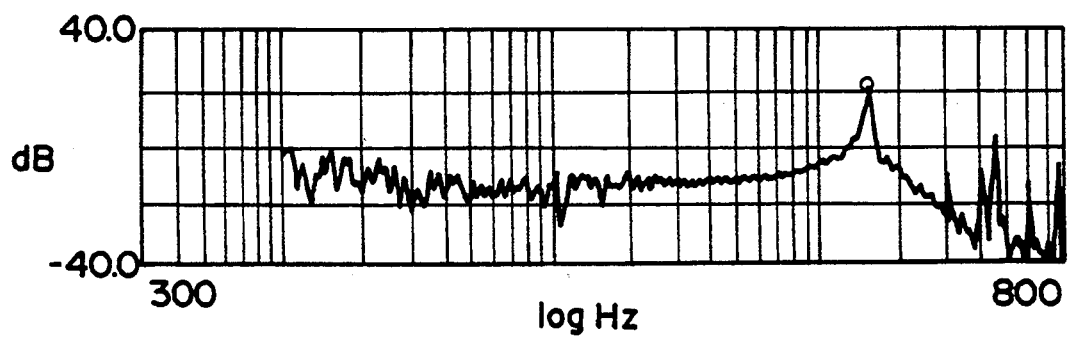
FIG. 12 is a graph illustrating the self-excited vibration of a positioning stage using the static pressure bearing device of FIG. 10.

If as in the present embodiment, the permeability or transmittance of the porous pad is $5 \times 10^{-6}$ m$^2$ or less and the porosity or porosity rate thereof is 20% or less, as compared with the popular porous pad as shown in FIGS. 10 and 11, the frequency area recovering the Re component and the frequency area exhibiting the highest Im component move toward the low frequency side as shown in FIGS. 3 and 4 and accordingly, it is very easy to set the natural frequency of the positioning stage to a frequency area in which the Re component and Im component are high as previously described.

Figure 8:
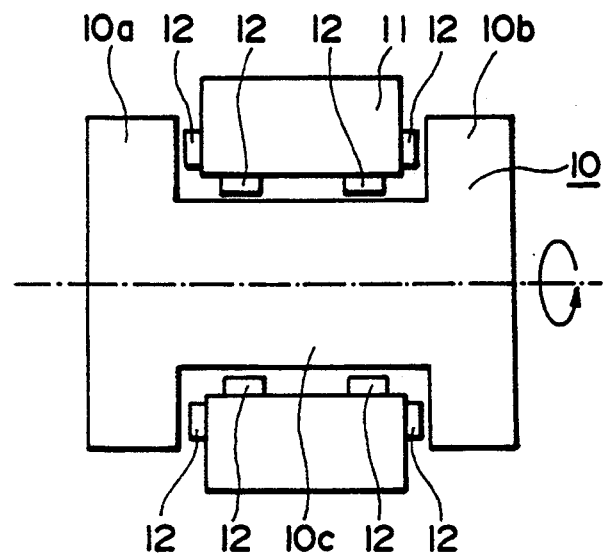
FIG. 8 is a schematic view illustrating a case where the static pressure bearing device is applied to a rotary shaft.

Also, the static pressure bearing device $E_1$ of the present embodiment can be used not only in the positioning stage, but in a rotary bearing device 11 holding a rotary shaft 10 having thrust plates 10a and 10b at the opposite ends thereof, as shown, for example, in FIG. 8. The rotary bearing device 11 has a plurality of opposed porous pads 12 on the thrust plates 10a, 10b and cylindrical portion 10c of the rotary shaft 10, and each porous pad 12 has a permeability and a porosity rate similar to those of the porous pad 3 of the static pressure bearing device $E_1$ of the present embodiment, and the other bearing parameters are set on the basis of the frequency characteristics of the Re component and Im component of each porous pad and the natural frequency of the rotary shaft 10, as previously described. As a result, the vibration such as centrifugal whirling of the rotary shaft, is reduced and the rotation thereof can be stabilized.

Figure 9:
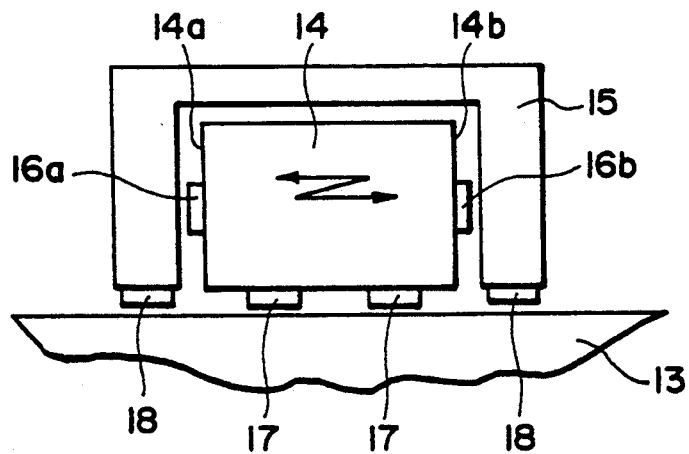
FIG. 9 is a schematic view illustrating a case where the static pressure bearing device is applied to a drive force transmitting mechanism.

Also, the static pressure bearing device $E_1$ of the present embodiment can be used in a drive force transmitting mechanism between a driving member 14 placed on a bed plate 13 and reciprocally movable in a predetermined axial direction and a driven member 15 moved in said direction thereby, as shown in FIG. 9. This drive force transmitting mechanism has porous pads 16a and 16b on both sides 14a and 14b, respectively, of the driving member 14, and the two porous pads spout pressurized gas toward the inner side of the inverted U-shaped frame member of the driven member 15. Also, the driving member 14 and driven member 15 are noncontact-supported on the bed plate 13 by porous pads 17 and 18, respectively. The porous pads 16a, 16b, 17 and 18 are similar to the aforedescribed porous pads 3 and 12 and therefore need not be described.

What is claimed is:

1. A static pressure bearing device comprising a porous restrictor type spouting device for spouting pressurized fluid into a gap between a pair of objects and noncontactly supporting the two objects by the static pressure thereof, static pressure in the gap having a periodic fluctuation component having a phase delay of 90° relative to the periodic fluctuation of the dimension of the gap when a periodic variation in the dimension of the gap occurs, the natural frequency of a vibration system of each of the objects being regulated such that the periodic fluctuation component is a positive value of a frequency equal to the natural frequency.

2. A static pressure bearing device according to claim 1, wherein said spouting device has a porous member having a permeability or transmittance of $5 \times 10^{-16}$ m$^2$ or less and having a porosity or porosity rate of 20% or less.

3. A static pressure bearing device for noncontactly supporting a movable bed relative to a fixed bed comprising:
   a porous pad for spouting fluid between the movable bed and the fixed bed; and
   a supply line for supplying pressurized fluid to said porous pad;
   the natural frequency of a system having the movable bed noncontactly supported relative to the fixed bed by the porous pad being regulated so as to be in a frequency area in which the pressure fluctuation characteristic of the fluid between the movable bed and the fixed bed delayed by 90° in phase relative to the spacing vibration between the movable bed and the fixed bed is positive.

4. A device according to claim 3, wherein said porous pad has a permeability or transmittance of $5 \times 10^{-16}$ m$^2$ or less and has a porosity or porosity rate of 20% or less.

5. A method of manufacturing a static pressure bearing device for noncontactly supporting a movable bed relative to a fixed bed comprising:
   measuring a variation in the static pressure of fluid between the movable bed and the fixed bed when the movable bed is vibrated at a predetermined frequency;
   detecting the pressure fluctuation characteristic of the fluid between the movable bed and the fixed bed delayed by 90° in phase relative to the spacing vibration between the movable bed and the fixed bed on the basis of the result of the measurement; and
   regulating the natural frequency of a system having the movable bed noncontactly supported relative to the fixed bed by a porous pad to thereby cause the natural frequency to exist in a frequency area in which the pressure fluctuation characteristic is positive.

* * * * *

UNITED STATES PATENT AND TRADEMARK OFFICE
CERTIFICATE OF CORRECTION

PATENT NO. : 5,382,095
DATED : January 17, 1995
INVENTOR(S) : K. Akutsu

It is certified that error appears in the above-indentified patent and that said Letters Patent is hereby corrected as shown below:

<u>COLUMN 1</u>

Line 21, "differ" should read --differ,--.

<u>COLUMN 6</u>

Line 25, "pad;" should read --pad,--.

Signed and Sealed this

Second Day of May, 1995

Attest:

BRUCE LEHMAN

*Attesting Officer*     *Commissioner of Patents and Trademarks*